US 6,593,788 B1
Jul. 15, 2003

(54) RANDOM SIGNAL GENERATOR AND METHOD FOR GENERATING A RANDOM SIGNAL

(76) Inventor: Richard Vogts, Engelbergerstrasse 1, Freiburg (DE), D-79106

( * ) Notice: Subject to any disclaimer, the term of this patent is extended or adjusted under 35 U.S.C. 154(b) by 0 days.

(21) Appl. No.: 09/936,313
(22) PCT Filed: Mar. 8, 2000
(86) PCT No.: PCT/EP00/01993
§ 371 (c)(1), (2), (4) Date: Sep. 11, 2001
(87) PCT Pub. No.: WO00/54406
PCT Pub. Date: Sep. 14, 2000

(30) Foreign Application Priority Data

Mar. 11, 1999 (DE) ........................ 199 10 729

(51) Int. Cl.⁷ ................................. G06F 1/02
(52) U.S. Cl. ..................... 327/164; 327/105; 708/252; 708/250; 331/78
(58) Field of Search ................ 327/105, 115, 327/164, 107; 331/78, 17; 708/250, 252, 251

(56) References Cited

U.S. PATENT DOCUMENTS 5,570,307 A * 10/1996 Takahasihi .................... 331/78
5,963,104 A * 10/1999 Buer ............................ 331/79
6,253,223 B1 * 6/2001 Sprunk ....................... 708/250

FOREIGN PATENT DOCUMENTS

| EP | 0119972 A1 | 9/1984 |
| EP | 0240546 B1 | 3/1987 |
| EP | 0782069 A1 | 2/1997 |
| WO | WO8701836 | 3/1987 |
| WO | WO9743709 | 11/1997 |

OTHER PUBLICATIONS

Petrie et al., Modeling And Simulation Of Oscillator–Based Random Number Generators, Dec. 5, 1996.
IBM Technical Disclosure Bulletin, vol. 30, No. 9, Feb. 1988, pp. 337–339.

* cited by examiner

Primary Examiner—Dinh T. Le
(74) Attorney, Agent, or Firm—Volpe and Koenig, P.C.

(57) ABSTRACT

A random signal generator (1) has at least two functional groups (2a, 2b, 2c) each of them having one random sequence generators (3a, 3b, 3c), one exclusive-or gate (4a, 4b, 4c) and one memory element (5a, 5b, 5c). One of the two inputs (6a, 6b, 6c) of the exclusive-or gate (4a, 4b, 4c) of each functional group (2a, 2b, 2c) is connected to a random sequence signal output (7a, 7b, 7c) of the random sequence generator (3a, 3b, 3c) of the functional group (2a, 2b, 2c) and the other input (8a, 8b, 8c) to a data output (9a, 9b, 9c) of the memory element (5a, 5b, 5c) of the functional group (2a, 2b, 2c). The output (10a, 10b, 10c) of the exclusive-or gate (4a, 4b, 4c) of each functional group (2a, 2b, 2c) is connected to the data input (11a, 11b, 11c) of the memory element (5a, 5b, 4c) of the functional group (2a, 2b, 2c). The memory elements (5a, 5b, 5c) of the functional groups (2a, 2b, 2c) are connected to one another via data lines (13) for the purpose of shifting their memory contents.

15 Claims, 4 Drawing Sheets

RANDOM SIGNAL GENERATOR AND METHOD FOR GENERATING A RANDOM SIGNAL

BACKGROUND

The invention concerns a method to generate a random signal and a random signal generator.

From the 'Alpha-particle random number generator' IBM TECHNICAL DISCLOSURE BULLETIN, Vol. 30, No.9, February 1988 (1988–02), pages 337–339, XP002140868 IBM CORP. NEW YORK, US ISSN: 0018-8689, a random signal generator is known, that has four non-deterministic random sequence generators, each of them having a feedback shift register. The shift registers are subjected to alpha radiation of a radioactive material, what generates, when penetrating in the semiconductor chip of the shift register, electron hole pairs, which can randomly change the memory content of the shift register. The outputs of two of the four random sequence generators are connected to the inputs of an exclusive-or gate. The outputs of this exclusive-or gate are connected to an input of a further exclusive-or gate, the output of which is connected to the random signal output. Therefore the random signal fed to the random signal output is generated by means of the exclusive-or gate by mixing the output signals of the individual random sequence generators, resulting in the random signal fed to the random signal output having a stronger random nature than the output signals of the individual random sequence generators. Nevertheless, by these measures the statistical independence of the signal levels or the random values of the random signal appearing at the output of the random signal generator is improved only to a limited extent. Although the quality of the random signal could be improved by that the number of the random sequence generators, the output signals of which are exclusive-or connected with one another, is correspondingly increased, the construction of the random signal generator, however, becomes more complicated and expensive. In addition, the random signal generator has the disadvantage that the alpha-radiation requires an expensive shielding to prevent damages to health and/or interference with other electrical circuits.

From WO 97/43709 a random signal generator is already known that has a non-deterministic random signal generator that has a voltage-controlled oscillator, the frequency control input of which is connected to a noise voltage source. On its output the oscillator has an oscillator signal, the frequency of which randomly fluctuates about a centre frequency corresponding to a stochastically changing noise voltage applied to the frequency control input. The random sequence generator has a plurality dynamic flip-flops, which with their data input are connected to a ring oscillator allocated to them. At the same time each flip-flop has its own ring oscillator, while the frequencies of these ring oscillators slightly deviate from one another and are greater in each case than the frequency of the voltage-controlled oscillator of the random signal generator. Each clock input of the flip-flops is connected to the output of the random signal generator, so that in the case of a clock slope of the oscillation signal of the voltage-controlled oscillator with randomly changing frequency one signal value of the individual oscillation signal of the ring oscillators is scanned and read into the flip-flop allocated to the respective ring oscillator. The signal values intermediately stored in the individual flip-flops are then emitted to a respective output of the flip-flop and form the random signal to be generated. On this occasion each signal fed to the outputs of the flip-flops represents a binary number of a random number to be generated with several digits. According to the patent, the binary values of the digital signals fed to the output of the flip-flops are to be evenly distributed, i.e. on average the outputs of the flip-flop should have an approximately equal number of logical "ones" and "zeros".

The prior known random number generator has, however, the disadvantage that the individual number signals or the binary positions of the random number allocated to them depend, to a certain degree, from one another. It may also result in a correlation of two random numbers which are read out immediately in succession from the random signal generator. Therefore, after a sufficiently long observation of the random numbers emitted by the random number generator, an observer can make conclusions regarding the properties of the random signal generator or random number generator, in particular regarding the properties of the ring oscillators contained therein. An additional disadvantageous fact is that a defect in the noise voltage source and/or in the voltage-controlled oscillator of the random signal generator may result in an oscillation of the voltage-controlled oscillator with a constant frequency, so that the correlation of the random numbers will strongly increase, i.e. the random nature of the random signals or the random numbers represented by this signal will decrease without the user of the random number generator noticing this. For certain applications, for example, when encoding messages or identifying a sender of a message by means of a "digital" signature, it is, however, necessary that the random nature of the generated signal or of the random numbers be as great as possible so that the random numbers could not be predicted.

From EP 0 782 069 A1 a pseudo-random number generator is known, that has several deterministic random sequence generators, each of them having an output for a pseudo-random signal. These outputs are connected to an input each of a combination device, that has an output for a combination signal formed by non-linear combination of the pseudo-random signals. The combination signal output is connected to the data input of a shift register having a plurality of memory elements, into which the data read out from the combination signal output can be sequentially read. The data outputs of the memory elements of the shift register are connected to an input each of a non-linear connecting device. This has an output for a signal that is formed by the non-linear combination of the data signals applied to the data outputs of the memory elements of the shift register. The individual positions of the random number to be generated are emitted on this output in succession synchronously with a clock signal. The prior known pseudo-random number generator has the disadvantage that the signal appearing on the output of the connecting device can be described by a mathematical function despite the relatively elaborate combination of several pseudo-random signals into a random number signal. Therefore the random numbers, generated with the random number generator, can be predicted with the knowledge of this mathematical function and the state of the random signal generator. An additional disadvantage is that the random signal generator has a relatively complicated construction.

A random signal generator is also known, wherein an analog noise signal of a noise source is amplified with a high-frequency amplifier and subsequently the signal level of this amplifier is digitalised. The random number to be generated is then sequentially read out on the output of the high-frequency amplifier, whereby both signal levels, defined by digitalising the amplifier output signal, are interpreted as binary values of a binary number. This random signal generator is, however, also relatively expensive, because for the purpose of avoiding correlations between the digital output signal of the random number generator and the analog noise signal an elaborate shielding of the high-frequency amplifier is required. In addition, the noise source has to be shielded against external electro-magnetic interferences.

SUMMARY

Therefore the task is to specify a method, with which a random signal, that has signal levels or random values which are, as far as possible, statistically independent from one another and uniformly distributed, can be generated. There is also the additional task to provide a random signal generator which, though having a simple construction, can generate as far as possible, statistically independent from one another and uniformly distributed signal levels, random values or random numbers.

Therefore in an advantageous manner random sequence signal values generated at different points of time are exclusive-or connected with one another, by virtue of which an even stronger random nature of the signal levels or random values of the generated random signals is achieved. Consequently a good approximation of a uniform distribution is achieved by the statistical distribution of the signal levels or random values of the generated random signal.

An embodiment of the method provides that the exclusive-or output signal is exclusive-or connected with the random sequence signal of at least one further non-deterministic random sequence generator and the exclusive-or output signal of this connection forms the intermediate signal for further processing. The statistical distribution of the signal levels or random values of the random signal generated is then even better approximated to a uniform distribution.

The above mentioned task regarding the method can be also solved by that at least two random sequence signals are generated by means of at least two non-deterministic random sequence generators, a) that one random signal value is determined from each random sequence signal of the individual random sequence generators and is exclusive-or connected to a stored value allocated to another random sequence generator, b) the result of this connection is intermediately stored on each occasion as new stored value, allocated to the first-mentioned random sequence generator, c) that steps a) and b) of the method are repeated at least once more as a loop, d) and that afterwards the stored values allocated to each individual random sequence generator are emitted as random signal.

Consequently a plurality of random sequence signals is generated with the aid of various random sequence generators, wherein these random sequence signals are combined with one another by means of exclusive-or connections corresponding to steps a) to d) of the method. In an advantageous manner a random signal can be generated by this method which has a greater random nature than the individual random sequence signals from which the random signal was mixed. Therefore the method makes it feasible to determine random numbers or random signals which are practically not correlated with one another and occur almost uniformly distributed by means of several relatively simply constructed random signal generators.

It is of advantage if the steps a) to d) of the method are repeated several times. This makes it possible to generate random numbers which have a greater number of digits or positions than the number of the random signal generators.

It is of advantage if the stored values are cyclically shifted in a data memory. In that case the random signal values generated by means of individual random sequence generators can be mixed even better.

It is particularly advantageous if the random sequence generators are reset to a defined condition or state before each renewed running of step a) of the method. Due to this, the correlation of the two signal values of the random signal determined in immediate succession can be additionally reduced.

A preferred embodiment of the method provides that for the generation of random sequence signals of the random sequence generators the frequency of each voltage-controlled oscillator is altered by means of a noise voltage signal and that the random signal value is determined from each oscillator signal of the oscillator. Consequently, the random signals can be generated in a simple manner already with a relatively good uniform distribution of their random signal values.

It is particularly advantageous if there is a delay of a defined period, that is equal to or greater than the period of the oscillator signal, before each renewed running of step a) of the method. The delay can be greater, for example, than ten times the period. Random signal values or random numbers determined successively or consecutively from the random signal have in this case an even lower correlation between them.

The above mentioned task regarding the random signal generator is solved with the features of patent claim 10.

By this it is possible random sequence signal values generated at different points of time are exclusive-or connect with one another, by virtue of which an even stronger random nature of the signal levels or random values of the generated random signals is achieved. The random signal generated by the random signal generator has a stronger random nature than the individual random sequence signals from which the random signal was mixed. Thus, even when using random sequence generators of simple construction, a good approximation of a uniform distribution can be achieved with the statistical distribution of the signal levels or random values of the random signal generated.

It is of advantage if at least one of the further intermediate stage has an exclusive-or gate, one input of which is connected to the output of the exclusive-or gate connected to the random sequence generators and the other input to the random sequence signal output of a further random sequence generator. In this case the statistical distribution of the signal levels or random values approximate a uniform distribution of the random signals generated with the random signal generator even better.

The above mentioned task regarding the random signal generator can be solved also by that the random signal generator has at least two functional groups, each of which has a non-deterministic random sequence generator, an exclusive-or gate and a memory element, wherein one of the two inputs of the exclusive-or gate of each functional group is connected to a random sequence signal output of the random sequence generator of the functional group and the other input to a data output of the memory element of the functional group, wherein the output of the exclusive-or gate of each functional group is connected to the data input of the memory element of the functional group, and wherein the memory elements of the functional groups are connected to one another via data lines for the purpose of shifting their memory contents.

Therefore in an advantageous manner each signal value of the random signal to be generated is formed from the random signal values of several, preferably of all random sequence generators, due to which the signal values of the random signal have a stronger random nature than the random signal values determined from the random sequence signals of the random sequence generators. Accordingly, the random signal generator makes it possible to determine random signals with almost perfectly uniformly distributed random nature of their signal values, even when the random nature of the random sequence signal values of the individual random sequence generators deviates from the ideal uniform distribution, as this is always the case in practice. In addition, random signal values determined successively with the random signal generator, exhibit only a very weak correlation. Therefore the individual random sequence generators of the random signal generator can have a relatively simple construction, resulting in a random signal generator having an overall simple construction that is economical to manufacture. In an advantageous manner in the case of a random signal generator, that has more than two random sequence generators, a good uniform distribution of the random nature of the random signal values and a weak correlation between the individual random signal values can be achieved even when one of the random sequence generators fails or when for other reasons, e.g. environmental influences (temperature, electromagnetic fields, manipulation attempts, etc.) and/or ageing processes, the random nature of the random sequence signal values is lost. Therefore the random signal generator is highly reliable in its operation.

The above mentioned task regarding the random signal generator can be solved also by that the random signal generator has at least two functional groups, each of them having a random sequence generator, an exclusive-or gate and a memory element, wherein one of the two inputs of the exclusive-or gate of each functional group is connected to a random sequence signal output of the random sequence generator of the functional group and the other input to a data output of the memory element of another functional group, and wherein the output of the exclusive-or gate is connected to the data input of the memory element of the first-mentioned functional group.

This invention also provides the advantage that additional data lines for shifting the memory contents between the memory elements can be omitted.

An embodiment of the invention provides that the memory element or the memory elements are part of a ring shift register. In this case, after each exclusive-or connection of the random signal values to the memory contents, the memory contents of the memory elements can be cyclically shifted in the ring memory in a simple manner. At the same time it is even possible for the ring shift register to have intermediate memory elements in addition to the memory elements of the functional groups. In this case additional digits of a random number to be determined can be intermediately stored in the intermediate memory elements. The number of digits or positions of the individual random numbers can be then greater than the number of the random sequence generators of the random signal generator.

It is particularly advantageous if the random signal generators have a reset input, by means of which the random signals of the random sequence generators can be transferred to a defined state. The random sequence generators can be then brought to a defined output state before determining a new random number, thus reducing the correlation between consecutively determined random numbers.

In the case of a preferred embodiment of the invention the random sequence generators have a voltage-controlled oscillator each, the frequency control input of which is connected to a noise voltage source, wherein the oscillator output is connected to the random sequence signal output of the random sequence generator. By virtue of this the random sequence signals can be generated in a simple manner and with a relatively good uniform distribution of the random nature of their random sequence signal values.

It is of advantage if the oscillator output is connected to the input of a flip-flop or a kind of frequency divider and if the output of the flip-flop is connected to the random sequence signal output of the random sequence generator. The flip-flop then inverts its output signal with every clock pulse of the oscillator, due to which a better uniform distribution of the random signal values obtained from the random signal present on the output of the random signal generator is achieved.

Particularly advantageous is if at least the exclusive-or gate(s) and possibly the ring shift register are part of a microprocessor. The random signal generator can be then particularly cost-effectively produced and constructed, for example, as an insertion card that has a bus terminal for the connection to the system bus of a microcomputer.

BRIEF DESCRIPTION OF THE DRAWINGS

In the following embodiments of the invention are explained in detail based on the drawing. They show in.

DETAILED DESCRIPTION OF THE PREFERRED EMBODIMENTS

Figure 1:
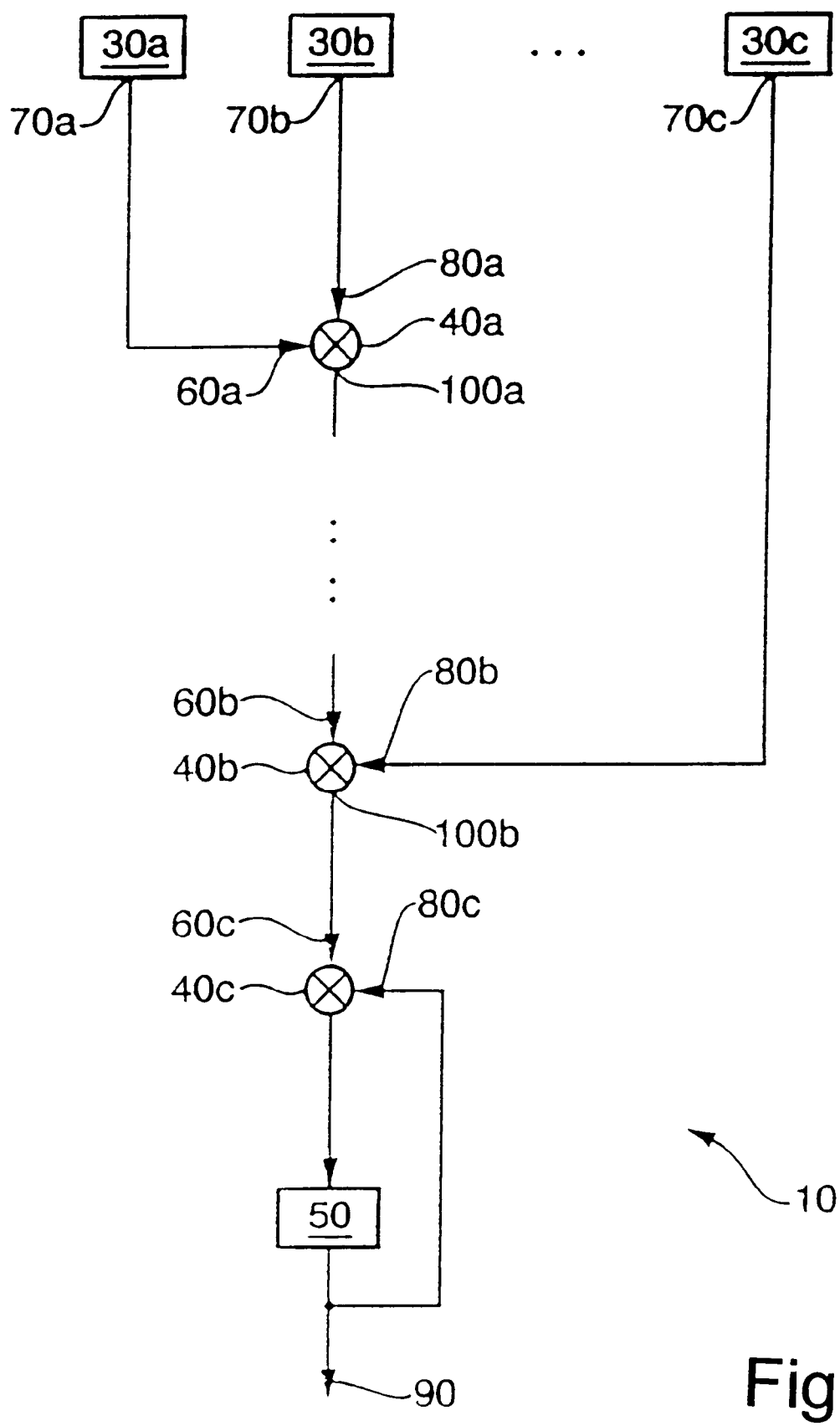
FIG. 1—a circuit diagram of a random signal generator that has a plurality of random sequence generators, of which only three are illustrated, FIGS. 2, 4—a circuit diagram of a random signal generator, that has a plurality of functional groups as well as a plurality of intermediate memory elements, wherein only three functional groups and only one intermediate memory element are illustrated, FIG. 3—a modification of the circuit diagram according to FIG. 2, wherein instead of the parallel random signal output shown in FIG. 2 the random signal generator has a serial random signal output, FIG. 5—a modification of the circuit diagram according to FIG. 4, wherein instead of the parallel random signal output shown in FIG. 4 the random signal generator has a serial random signal output, and FIG. 6—a block circuit diagram of the random signal generator.

The random signal generator shown in FIG. 1, designated in to by the numeral 10, has a plurality of non-deterministic random sequence generators 30a, 30b, 30c and a plurality of exclusive-or gate 40a, 40b, 40c. The random sequence signal output 70a of the random sequence generator 30a is connected to a first input 60a and the random sequence signal output 70b of the random sequence generator 30b to a second input 60a of the exclusive-or gate 40a. The intermediate signal present at the output 100a of the exclusive-or gate 40a, formed by mixing the random sequence signals of the two random sequence generators 30a, 30b, has a greater random content than any of the random sequence signals present at the inputs 60a, 80a.

The intermediate signal present at the output 100a of the exclusive-or gate 40a is directly or indirectly connected via at least one intermediate stage (not illustrated) to the first input 60b of the exclusive-or gate 40b for the purpose of further processing of the intermediate signal. The second input 80b of this exclusive-or gate 40b is connected to the random sequence signal output 70c of a further random sequence generator 30b. The random signal present at output 100b of the exclusive-or gate 40b connected to an output terminal of the random signal generator 10 has a greater random content than any of the random sequence signal outputs 70a, 70b, 70c. Thus a good approximation of a uniform distribution is achieved by the distribution of the signal values of the random signal.

Between the output 100a of the exclusive-or gate 40a and the input 60b of the exclusive-or gate 40b at least one intermediate stage can be provided or a plurality of intermediate stages connected in series can be provided. The construction of these intermediate stages corresponds to the arrangement formed from the exclusive-or gate 40b and the random sequence generator 30c, wherein one input each of the exclusive-or gate of the intermediate stage is connected to the output of the exclusive-or gate connected adjacently upstream in series and the output of the exclusive-or gate of the intermediate stage is connected to an input of the exclusive-or gate connected adjacently downstream in series.

As this can be seen from FIG. 1, an intermediate stage can be connected downstream to the exclusive-or gate 40b, which intermediate stage has a further exclusive-or gate 40c, the first input 60c of which is connected to the output 100b of the exclusive-or gate 40b. To the output of the exclusive-or gate 40c the data input of a memory element 50 is connected, the output of which is connected via a feedback loop to the second input 80c of this exclusive-or gate 40c. This will achieve that random sequence signals or signals derived from them generated by the random sequence generators 30a, 30b, 30c successively in time are mixed with one another. The data output of the memory element 50 is connected to the random signal output of the random signal generator 10.

The random signal generators, designated in to by the numeral 1 and shown in FIGS. 2 to 5, have a plurality of functional groups 2a, 2b, 2c each, each of them having a non-deterministic random sequence generator 3a, 3b, 3c, an exclusive-or gate 4a, 4b, 4c and a memory element 5a, 5b, 5c. In the case of the embodiment according to FIG.2 the exclusive-or gate 4a, 4b, 4c of each functional group 2a, 2b, 2c is connected with one of its two inputs 6a, 6b, 6c to a random signal output 7a, 7b, 7c of the random sequence generators 3a, 3b, 3c of the functional group 2a, 2b, 2c and with its other input 8a, 8b, 8c to a data output 9a, 9b, 9c of the memory element 5a, 5b, 5c of the functional group 2a, 2b, 2c. It can be further seen from FIG. 2 that the memory elements 5a, 5b, 5c are parts of a ring shift register and that this has additional intermediate memory elements 12, which by means of data lines 13 are connected into a ring with the memory elements 5a, 5b, 5c of the functional groups 2a, 2b, 2c. The stored values filed in the memory elements 5a, 5b, 5c can be cyclically shifted in the ring shift register by means of the data lines 13.

The individual processing steps of the random signal generator 1 to determine a random signal or a random number is explained in detail in the following. First the memory elements 5a, 5b, 5c and the intermediate memory 12 are occupied with a specified memory value, for example a logical 0 or a logical 1. From the random signal of each random sequence generator 3a, 3b, 3c a random sequence signal value each is determined, e.g. by scanning the random sequence signal. The signal, corresponding to this random signal value, present at each random signal output 7a, 7b, 7c of a functional group 2a, 2b, 2c is exclusive-or connected in the gate 4a, 4b, 4c to each data signal that corresponds to the memory value filed in the memory element 5a, 5b, 5c of the functional group 2a, 2b, 2c. The result of this connection is stored by means of the data input 11a, 11b, 11c as new memory value in the respective memory element 5a, 5b, 5c of the relevant functional group 2a, 2b, 2c.

Afterwards the memory values are shifted to the right in the ring memory, formed by the memory elements 5a, 5b, 5c and the intermediate memory elements 12 by a number of positions or bits corresponding to the number of the random sequence generators 3a, 3b 3c. Because the number of the memory elements 5a, 5b, 5c corresponds to the number of the intermediate storage elements 12, the signal values filed previously in the memory elements 5a, 5b, 5c are now intermediately stored in the intermediate memory elements.

Afterwards the random sequence signals of the random sequence generators 3a, 3b, 3c are reset to their initial state. Subsequently there is a delay of a specified period until the random sequence signals of the random sequence generators 3a, 3b, 3c assume a random value. From the individual random sequence signals of he functional groups 2a, 2b, 2c a random sequence signal value each is determined. By means of the exclusive-or gate 4a, 4b, 4c of the respective functional group 2a, 2b, 2c this is exclusive-or connected to the memory value contained in the memory element 5a, 5b, 5c of this functional group 2a, 2b, 2c in the manner described above and filed in the respective memory element 5a, 5b, 5c of the functional group 2a, 2b, 2c.

Afterwards the data values stored in the ring shift register are shifted in the ring shift register cyclically to the right by a number of positions which are greater by 1 than the number of the random sequence generators 3a, 3b, 3c. In addition, the random sequence signals of the random sequence generators 3a, 3b, 3c are reset to the initial state. Afterwards there is a delay of a specified period until each random sequence signal has assumed a random value.

With the exception of the first step of the process, wherein the memory elements 5a, 5b, 5c and the intermediate memory 12 can be prior occupied, the above described steps of the method can be repeated as a loop, possibly once or several times. In practice it has shown itself to be of advantage, if in the case of a random signal generator 1, the ring shift register of which has a width of 8 bits, that is passed through the loop defined by the steps of the process mentioned by a total of sixteen times i.e. sixteen complete primary bytes are read in and processed. Afterwards the random number is read out as binary numbers parallel on the data outputs 9a, 9b, 9c, 9d.

With regard to their random nature, the random numbers generated by means of the random signal generator 1 have an almost uniform distribution. At the same time the individual random numbers are not correlated at all or only insignificantly. This is achieved above all because the random signal values generated by means of different random sequence generators 3a, 3b, 3c are mixed with one another. The random signal values are not correlated with one another. When connecting the individual input signals present at the inputs 6a, 6b, 6c and 8a, 8b, 8c of the exclusive-or gate 4a, 4b, 4c and having a certain random content, an output signal having a greater random content than any of the two input signals appears on the outputs 10a, 10b, 10c of the exclusive-or gate 4a, 4b, 4c, i.e. the output signal has a more random character than either input signal.

Figure 2:
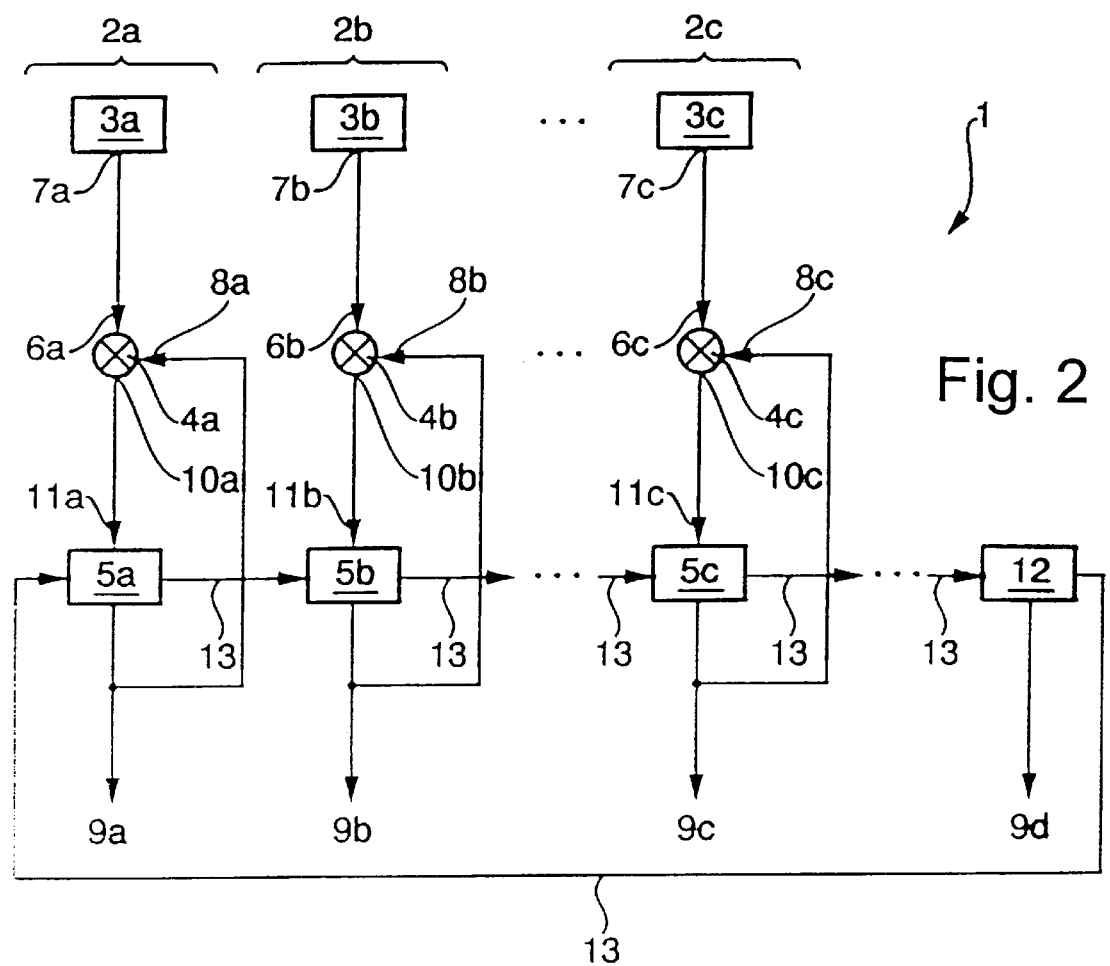
Figure 3:
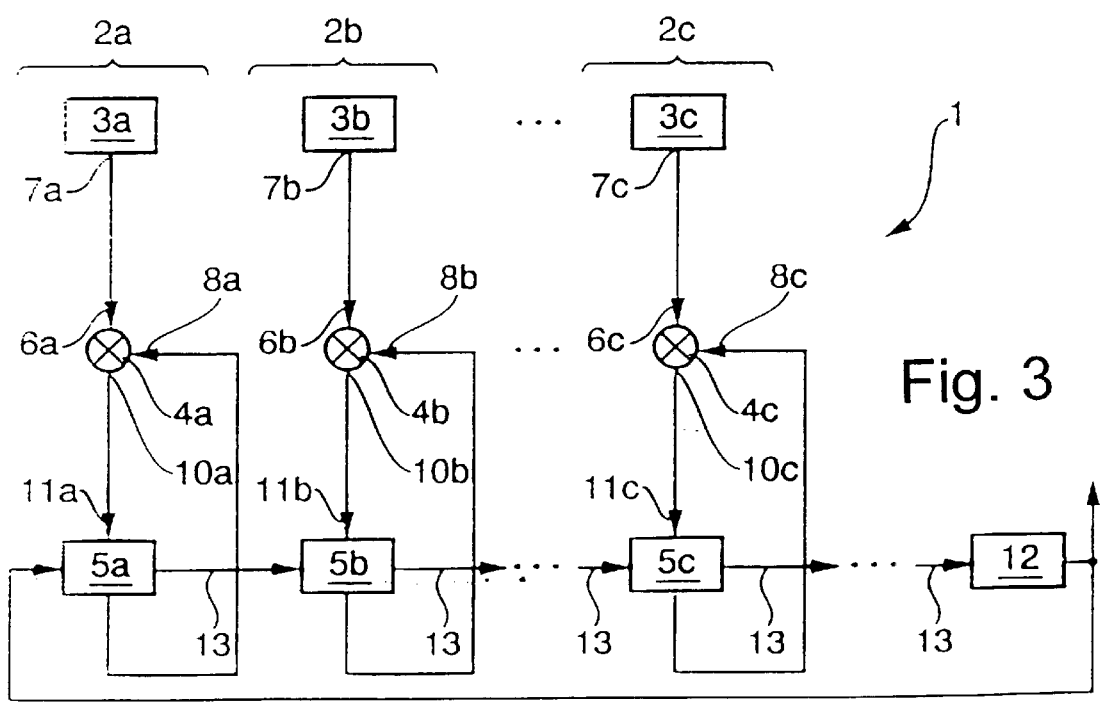
Figure 4:
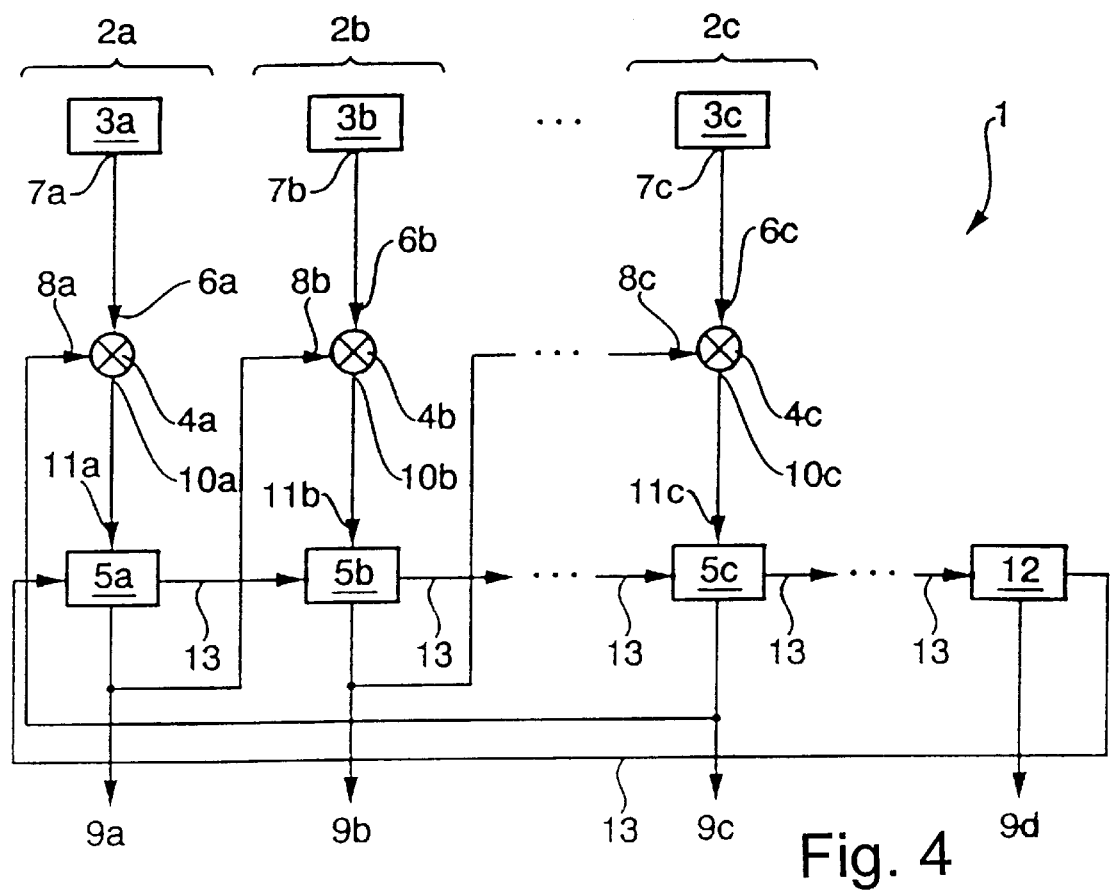
Figure 5:
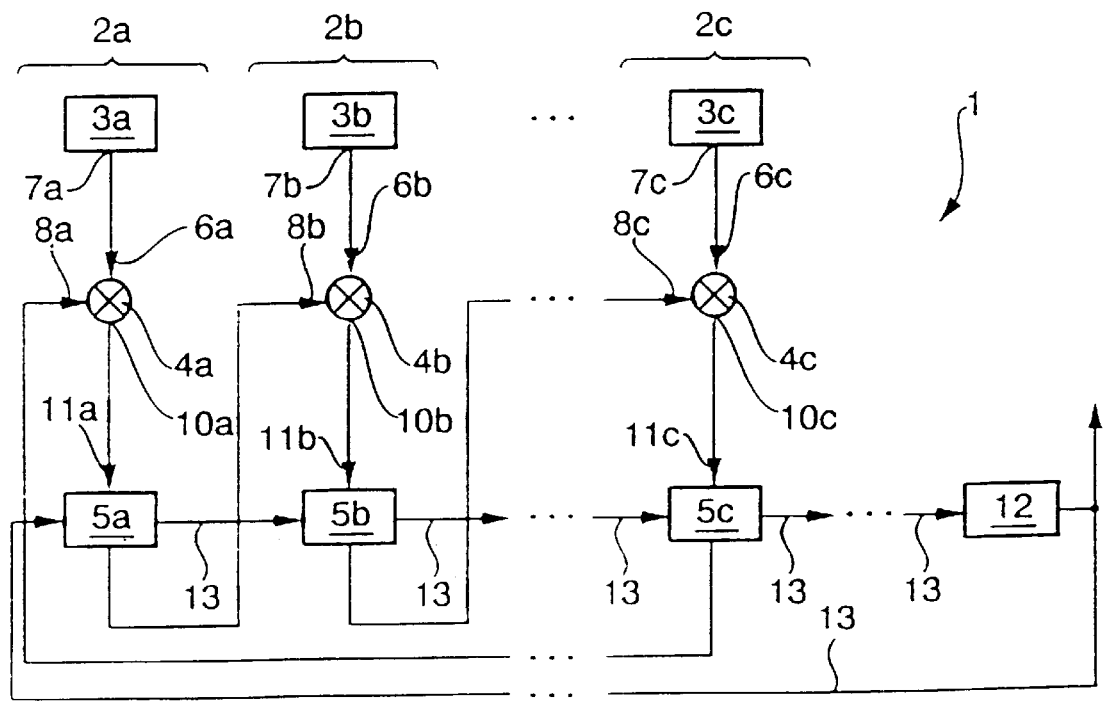

FIG. 4 shows a further embodiment of a random signal generator or random number generator 1, the construction of which corresponds basically to that shown in FIG. 2, but with the difference that the second input 8a, 9b, 8c of each exclusive-or gate 4a, 4b, 4c is connected to the respective data output 9c, 9a, 9b of a memory element 5c, 5a, 5b of another functional group 2b, 2c, 2a.

In the case of the embodiments according to FIGS. 2 and 4 each random signal generator has a parallel random signal output. This has a plurality of terminals which are connected to the data output 9a, 9b, 9c, 9d of a memory element 5a, 5b, 5c, 5d or of an intermediate memory element 12. In the case of the embodiments according to FIGS. 3 and 5 a serial random signal output is provided in each case, that is connected to the output of the intermediate memory element 12.

Figure 6:
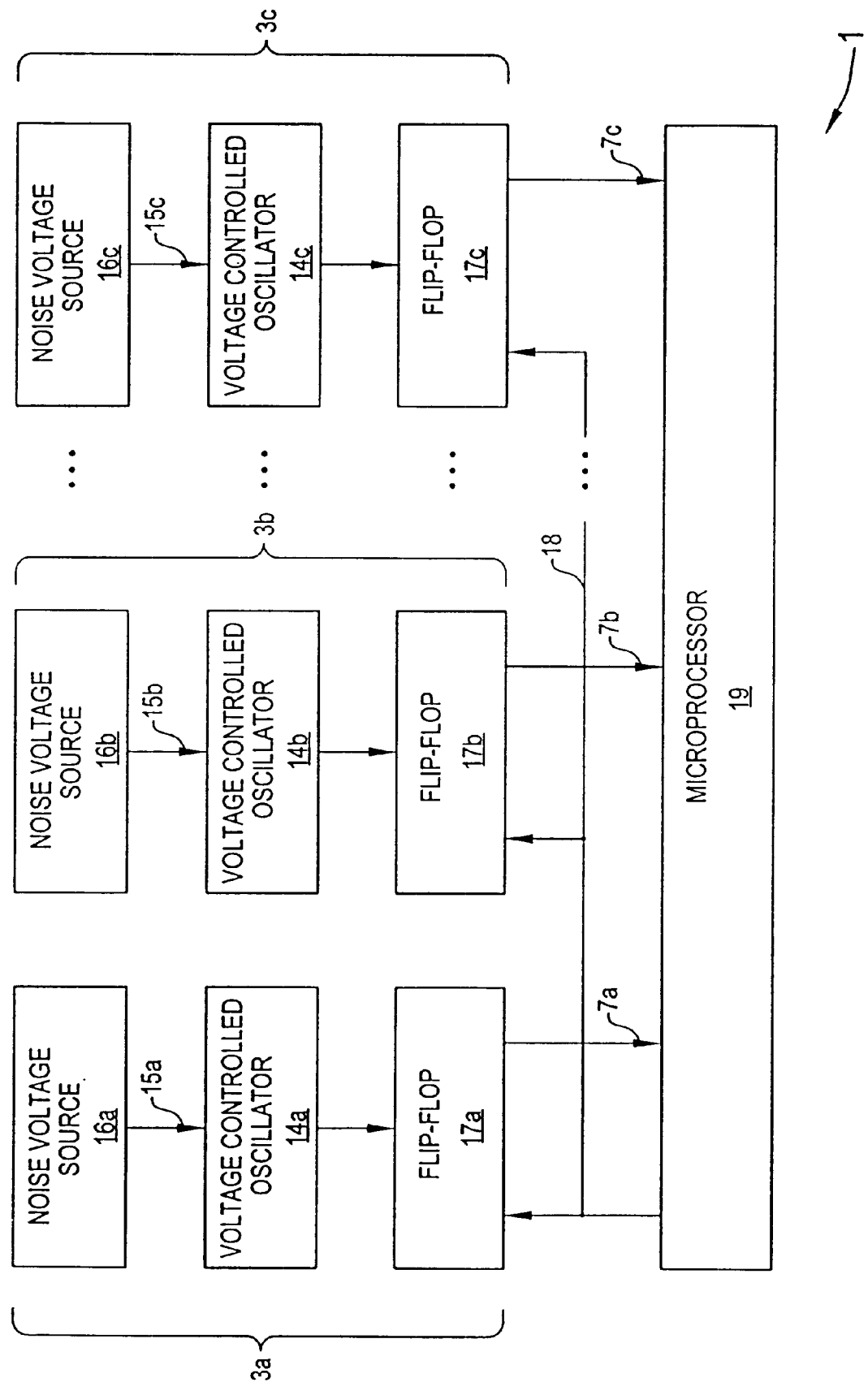

As it can be seen from FIG. 6, each individual random sequence generator 3a, 3b, 3c has a voltage-controlled oscillator 14a, 14b, 14c, having a frequency control input 15a, 15b, 15c that is connected to the output of a noise voltage source 16a, 16b, 16c. The oscillator output of each oscillator 14a, 14b, 14c is connected to the input of a flip-flop 17a, 17b, 17c, respectively, the output of which forms the random sequence signal output 7a, 7b, 7c. To set back the random sequence signal present at the random sequence signal output 7a, 7b, 7c, each flip-flop 17a, 17b, 17c has a set-back input. The set-back inputs are connected to one another by means of a set-back line 18 and a microprocessor 19. The exclusive-or gates 4a, 4b, 4c, the memory elements 5a, 5b, 5c and the intermediate storage elements 12 are arranged in the microprocessor 19.

It should also be mentioned that in the case of the embodiments according to FIGS. 2 to 6 the random sequence generators 3a, 3b, and/or 3c can have also at least two non-deterministic random sequence generators (30a, 30b) and at least one exclusive-or gate (40a).

What is claimed is:

1. A method to generate a random sequence signal, comprising providing at least two non-deterministic random sequence generators (3a, 3b, 3c) from which at least two random sequence signals are generated,
   a) determining one random signal value from each random sequence signal of the individual random sequence generators (3a, 3b, 3c) and exclusive-or combining the one random signal value with a stored value that is allocated to another random sequence generator. (3a, 3b, 3c),
   b) intermediately storing a result of the combination of the random signal value and the stored value on each occasion as a new stored value, allocated to the first-mentioned random sequence generator (3a, 3b, 3c),
   c) repeating the steps a) and b) at least once more,
   d) and afterwards emitting the stored values allocated to each individual random sequence generator (3a, 3b, 3c) as a random signal.

2. A method according to claim 1, wherein the steps a) to d) of the method are repeated several times.

3. A method according to claim 1, wherein the stored values are cyclically shifted in a data memory.

4. A method according to claim 1, wherein the random sequence generators (3a, 3b, 3c) are reset to a defined state before each renewed running of step a) of the method.

5. A method according to claim 1, wherein the steps a) to d) of the method are carried out by a microprocessor.

6. A method according to claim 1, wherein for the generation of random sequence signals of the random sequence generators (3a, 3b, 3c) a frequency of each voltage-controlled oscillator (14a, 14b, 14c) of the random sequence generators is altered by a noise voltage signal and the random signal value is determined from each oscillator signal of the oscillator (14a, 14b, 14c).

7. A method according to claim 6, wherein there is a delay of a defined period, that is equal to or greater than a period of the oscillator signal, before each renewed running of step a) of the method.

8. A random signal generator (1), comprising at least two functional groups (2a, 2b, 2c), each functional group has a non-deterministic random sequence generator (3a, 3b, 3c), an exclusive-or gate (4a, 4b, 4c) and a memory element (5a, 5b, 5c), wherein one of two inputs (6a, 6b, 6c) of the exclusive-or gate (4a, 4b, 4c) of each functional group (2a, 2b, 2c) is connected to a random sequence signal output (7a, 7b, 7c) of the random sequence generator (3a, 3b, 3c) of the functional group (2a, 2b, 2c) and the other input (8a, 8b, 8c) is connected to a data output (9a, 9b, 9c) of the memory element (5a, 5b, 5c) of the functional group (2a, 2b, 2c), wherein an output (10a, 10b, 10c) of the exclusive-or gate (4a, 4b, 4c) of each of the functional groups (2a, 2b, 2c) is connected to a data input (11a, 11b, 11c) of the memory element (5a, 5b, 4c) of the functional group (2a, 2b, 2c), and wherein the memory elements (5a, 5b, 5c) of the functional groups (2a, 2b, 2c) are connected to one another via data lines (13) for shifting their memory contents.

9. A random signal generator (1) according to claim 8, wherein the memory element (5a, 5b, 5c, 50) or the memory elements (5a, 5b, 5c, 50) are part of a ring shift register.

10. A random signal generator (1) according to claim 9, wherein the ring shift register has intermediate memory elements (12) in addition to the memory elements (5a, 5b, 5c) of the functional groups (2a, 2b, 2c).

11. A random signal generator (1) according to claim 8, wherein the random signal generators (3a, 3b, 3c, 30a, 30b, 30c) have a reset input, by means of which random sequence signals of the random sequence generators (3a, 3b, 3c, 30a, 30b, 30c) can be transferred to a defined state.

12. A random signal generator (1) according to claim 8, wherein the random sequence generators (3a, 3b, 3c, 30a, 30b, 30c) each have a voltage-controlled oscillator (14a, 14b, 14c), a frequency control input (15a, 15b, 15c) of which is connected to a noise voltage source (16a, 16b, 16c) and an oscillator output is connected to the random sequence signal output (7a, 7b, 7c, 70a, 70b, 70c) of the random sequence generator (3a, 3b, 3c, 30a, 30b, 30c).

13. A random signal generator (1) according to claim 12, wherein the oscillator output is connected to an input of a flip-flop (17a, 17b, 17c) or a frequency divider and an output of the flip-flop (17a, 17b, 17c) is connected to the random sequence signal output (7a, 7b, 7c, 70a, 70b, 70c) of the random sequence generator (3a, 3b, 3c, 30a, 30b, 30c).

14. A random signal generator (1) according to claim 8, wherein at least the exclusive-or gate(s) (4a, 4b, 4c, 40a, 40b, 40c) are part of a microprocessor (19).

15. A random signal generator (1), comprising at least two functional groups (2a, 2b, 2c), each functional group having a non-deterministic random sequence generator (3a, 3b, 3c), an exclusive-or gate (4a, 4b, 4c) and a memory element (5a, 5b, 5c), wherein one of two inputs (6a, 6b, 6c) of exclusive-or gate (4a, 4b, 4c) of each of the functional groups (2a, 2b, 2c) is connected to a random sequence signal output (7a, 7b, 7c) of the random sequence generator (3a, 3b, 3c) of the functional group (2a, 2b, 2c) and the other input (8a, 8b, 8c) is connected to a data output (9c, 9a, 9b) of the memory element (5c, 5a, 5b) of another functional group (2b, 2c, 2a), and wherein an output (10a, 10b, 10c) of the exclusive-or gate (4a, 4b, 4c) is connected to data input (11a, 11b, 11c) of the memory element (5a, 5b, 5c) of the first-mentioned functional group (2a, 2b, 2c).

* * * * *